United States Patent [19]

Eto et al.

[11] Patent Number: 4,698,811
[45] Date of Patent: Oct. 6, 1987

[54] METHOD AND APPARATUS FOR GENERATING ERROR CORRECTION CODES FOR DIGITIZED PICTURE SIGNAL RECORDING/REPRODUCING

[75] Inventors: Yoshizumi Eto, Sagamihara; Masuo Umemoto, Tokyo; Hidehiro Kanada, Kodaira; Seiichi Mita, Kanagawa, all of Japan

[73] Assignees: Hitachi, Ltd.; Hitachi Denshi Kabushiki Kaisha, both of Tokyo, Japan

[21] Appl. No.: 756,706

[22] Filed: Jul. 19, 1985

[30] Foreign Application Priority Data

Sep. 19, 1984 [JP] Japan ............................. 59-194722

[51] Int. Cl.⁴ ............................................. G06F 11/12
[52] U.S. Cl. ...................................... 371/38; 358/340
[58] Field of Search ................. 371/37, 38, 39, 40, 371/43, 44, 45, 49, 50, 51; 358/340, 310, 328, 320; 360/32

[56] References Cited

U.S. PATENT DOCUMENTS

| | | | |
|---|---|---|---|
| 4,549,227 | 10/1985 | Hashimoto et al. | 358/310 |
| 4,549,298 | 10/1985 | Creed | 371/38 |
| 4,555,784 | 11/1985 | Wood | 371/38 |
| 4,564,945 | 1/1986 | Glover | 371/38 |
| 4,597,083 | 6/1986 | Stenerson | 371/38 |

OTHER PUBLICATIONS

Heitmann, J. K. R., "Digital Video Recording: New Results in Channel Coding and Error Protection", SMPTE Journal, Feb. 1984, pp. 140–144.

Hirano, Y., "A Study on Variable-Speed Reproduction of the Digital VTR", SMPTE Journal, Jun. 1983, pp. 639–641.

Primary Examiner—Michael R. Fleming
Attorney, Agent, or Firm—Antonelli, Terry & Wands

[57] ABSTRACT

An apparatus for recording or reproducing codes resulting from digitalizing a picture signal on or from a video tape recorder includes a device for correcting code error produced due to interference in the course of recording or reproducing process. The pixel codes succeeding to one another in time are divided to high-order and low-order bit-blocks, respectively, wherein the high-order bits are used to constitute a pseudo pixel code which is then added with a pixel error correcting code. The pixel code consisting of the high-order bits is added with a bit error correcting code before being recorded. In reproduction, error correction can be realized at higher rate with the aid of the correction codes to improve the quality of reproduced picture.

10 Claims, 11 Drawing Figures

FIG. 1a TWO DIMENSIONAL ARRANGEMENT OF b-ADJACENT CODE AND CRCC ANNEXED TO PIXEL CODES

| W(1.1) | W(1.2) | W(1.3) | ---- | W(1.18) | R(1) |
|---|---|---|---|---|---|
| W(2.1) | W(2.2) | W(2.3) | ---- | W(2.18) | R(2) |
| ⋮ | ⋮ | ⋮ | ⋮ | ⋮ | R(m) |
| W(17.1) | W(17.2) | W(17.3) | ---- | W(17.18) | R(17) |
| W(18.1) | W(18.2) | W(18.3) | ---- | W(18.18) | R(18) |
| P(1) | P(2) | P(3) | ---- | P(18) | R(19) |
| Q(1) | Q(2) | Q(3) | ---- | Q(18) | R(20) |

FIG. 1b TWO DIMENSIONAL ARRANGEMENT OF b-ADJACENT CODE ANNEXED TO PIXEL CODES

| W(1.1) | W(1.2) | W(1.3) | ---- | W(1.18) |
|---|---|---|---|---|
| W(2.1) | W(2.2) | W(2.3) | ---- | W(2.18) |
| ⋮ | ⋮ | ⋮ | ⋮ | ⋮ |
| W(17.1) | W(17.2) | W(17.3) | ---- | W(17.18) |
| W(18.1) | W(18.2) | W(18.3) | ---- | W(18.18) |
| P(1) | P(2) | P(3) | ---- | P(18) |
| Q(1) | Q(2) | Q(3) | ---- | Q(18) |

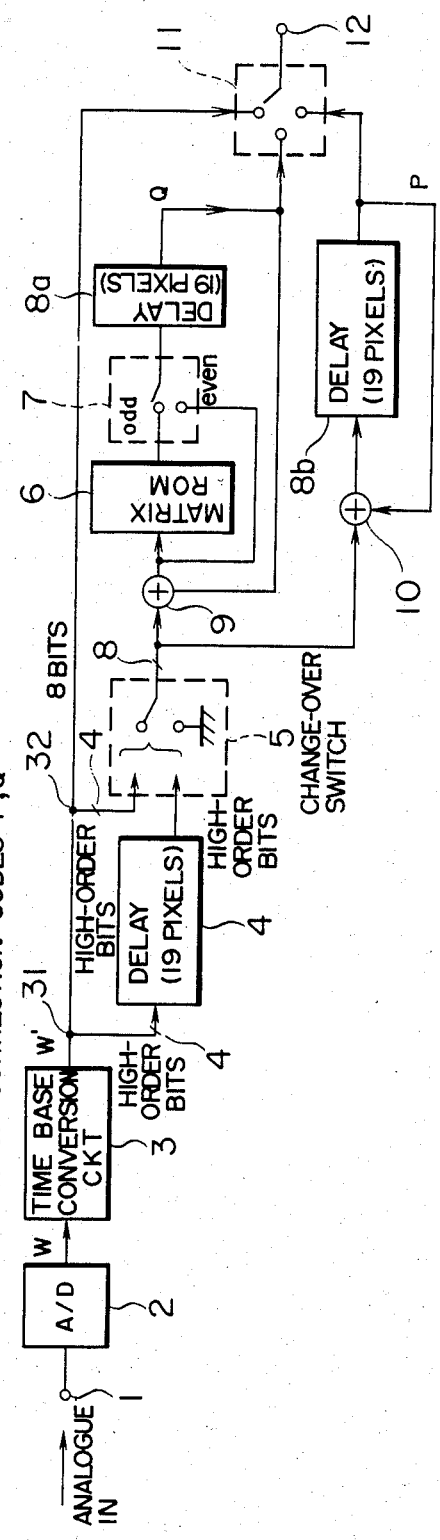
FIG. 2 GENERATION OF CORRECTION CODES P, Q
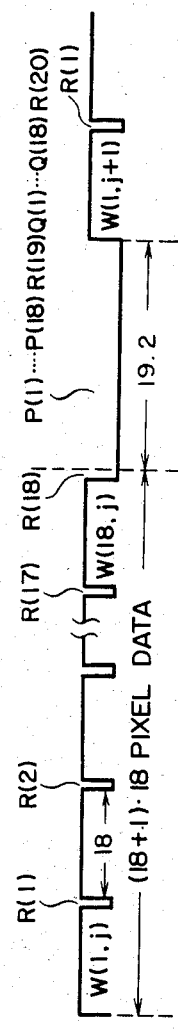
FIG. 3a
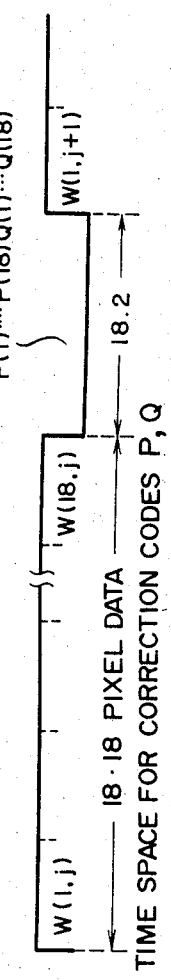
FIG. 3b

FIG. 5 b-ADJACENT CODES P,Q AT OUTPUT 12

| W'(1.1) | W'(1.2) | W'(1.3) | — — — — | W'(1.18) | ? |
|---|---|---|---|---|---|
| ⋮ | ⋮ | ⋮ | ⋮ | ⋮ | ⋮ |
| W'(9.1) | W'(9.2) | W'(9.3) | — — — — | W'(9.18) | ? |
| P(1) | P(2) | P(3) | — — — — | P(18) | ? |
| Q(1) | Q(2) | Q(3) | — — — — | Q(18) | ? |

( ? : MEANINGLESS CODE )

FIG. 7

CRCC AT OUTPUT 19

| $\overset{*}{W}(1.1)$ | $\overset{*}{W}(1.2)$ | $\overset{*}{W}(1.3)$ | — — — — | $\overset{*}{W}(1.18)$ | R(1) |
|---|---|---|---|---|---|
| $\overset{*}{W}(2.1)$ | $\overset{*}{W}(2.2)$ | $\overset{*}{W}(2.3)$ | — — — — | $\overset{*}{W}(2.18)$ | R(2) |
| ⋮ | ⋮ | ⋮ | ⋮ | ⋮ | ⋮ |
| $\overset{*}{W}(17.1)$ | $\overset{*}{W}(17.2)$ | $\overset{*}{W}(17.3)$ | — — — — | $\overset{*}{W}(17.18)$ | R(17) |
| $\overset{*}{W}(18.1)$ | $\overset{*}{W}(18.2)$ | $\overset{*}{W}(18.3)$ | — — — — | $\overset{*}{W}(18.18)$ | R(18) |
| P(1) | P(2) | P(3) | — — — — | P(18) | R(19) |
| Q(1) | Q(2) | Q(3) | — — — — | Q(18) | R(20) |

$\overset{*}{W}$ = 4 HIGH-ORDER BIT OF W + CONSTANT (LOW-ORDER BITS)

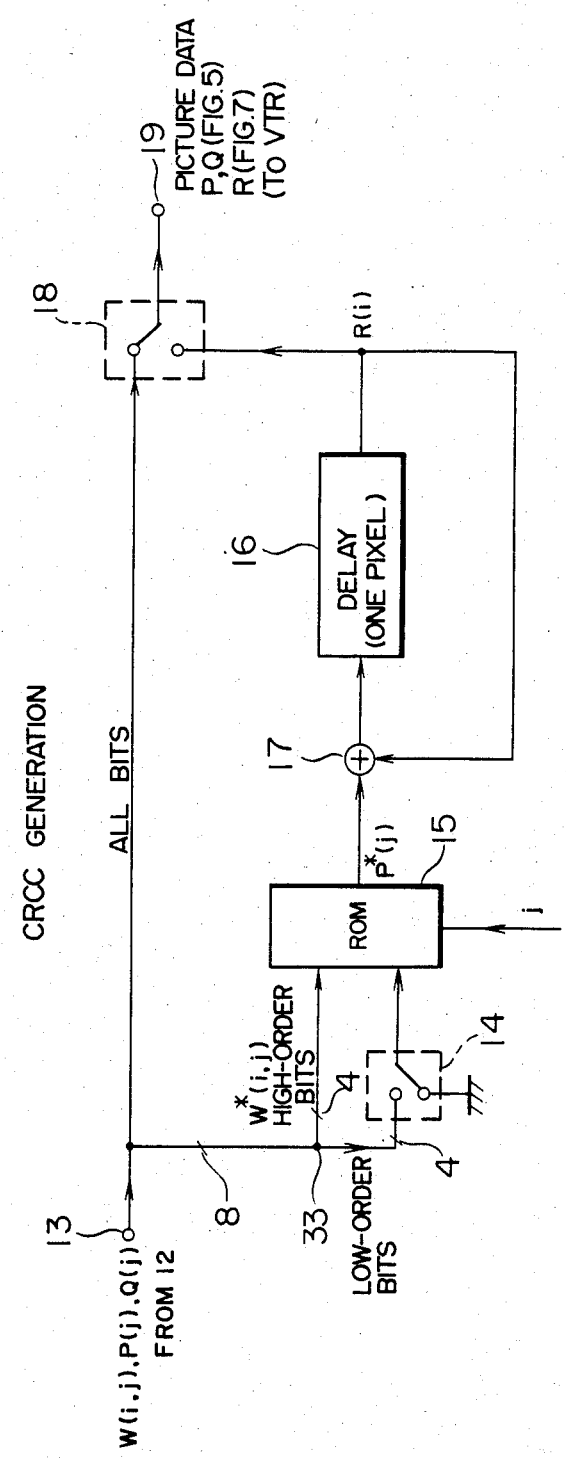

METHOD AND APPARATUS FOR GENERATING ERROR CORRECTION CODES FOR DIGITIZED PICTURE SIGNAL RECORDING/REPRODUCING

BACKGROUND OF THE INVENTION

The present invention relates to a code error correcting method and apparatuss which allows a picture signal coded in a digital form to be magnetically or optically recorded on a recording medium with an improved efficiency.

In a system for recording a picture signal in the form of a digital signal such as, for example, a digital video tape recorder or VTR, a function or capability of error correction and/or error detection is required for alleviating the influence of erroneous code (also referred to as code error) produced in the course of the recording and/or reproducing process.

Most of the systems for coding the analogue picture signal or image signal, such as component signals including the chrominance (I, Q) signal and the luminance (Y) signal or a composite signal by using eight bits for each of the picture elements or pixels, are usually so arranged as to correct or detect any code error produced at any one of the eight bits. However, in the case of the picture signal, the degree of degradation in the image quality differs significantly in dependence on whether the code error occurs at the first bit position (most significant bit or MSB position) or at the eighth bit (least significant bit or LSB) position. In other words, code error of the more significant bit brings about correspondingly greater degradation in the image or picture quality.

There is disclosed in Heightmann's article "Digital Video Recording: New Results in Channel Coding and Error Protection" contained in "SMPTE Journal", February 1984, p.p. 140-144 an error correction system in which a coding scheme having the highest error correcting capability is adopted for the first bit, and a coding scheme of a slightly reduced error correction capability is adopted for the second bit with a coding scheme of further reduced correction capability being adopted for the third bit, while no error correction is made for the fourth to eighth bits.

The error correction system mentioned above can certainly improve the residual code error ratio (i.e. degradation in the image quality) after the error correction. However, this system suffers a drawback in that because of different coding schemes adopted for the different bits, the structure of all codes to be recorded on the VTR is extremely complicated, whereby the number of units required for realizing this coding system is increased. Besides, some types of the error correction codes are suited for processing on a pixel basis and thus the processings which differ for each of the bits are difficult to be realized by using such type of error code. By the way, there is neither teaching nor suggestion of a solution of the aforenoted problems which contradict one another.

As the error correction code, the b-adjacent code and cyclic redundancy check code are known, as disclosed in Yasuhiro Hirano et al's article "A Study on Variable-Speed Reproduction of the Digital VTR" contained in "SMPTE Journal", June 1983.

A typical example of the hitherto known error correction processings, which are performed on the basis of a pixel represented by one word consisting of a number of bits and in which the b-adjacent code is used as the error correction code will be discussed.

For the picture or pixel signal of eight bits, it is preferred that the parameter b of the b-adjacent code is selected to be equal to 8. By way of example, assuming that the code errors possibly appearing in 18 pixels are to be corrected or detected, the first to eighth bits of the i-th pixel are presented by $a_{i1}$, $a_{i2}$, $a_{i3}$, ... $a_{i7}$, $a_{i8}$ and expressed in a matrix W(i), as follows:

$$W(i) = \begin{pmatrix} a_{i1} \\ a_{i2} \\ a_{i3} \\ \vdots \\ a_{i7} \\ a_{i8} \end{pmatrix} = \tag{1}$$

Then, matrices P and Q for the correction code each including eight bits are obtained as given by the following expressions:

$$P = \sum_{i=1}^{18} W(i) \tag{2}$$

$$Q = \sum_{i=1}^{18} T^{18-i} W(i) \tag{3}$$

where T is given by the following matrix.

$$T = \begin{pmatrix} 0 & 0 & 0 & 0 & 0 & 0 & 0 & 1 \\ 1 & 0 & 0 & 0 & 0 & 0 & 0 & 0 \\ 0 & 1 & 0 & 0 & 0 & 0 & 0 & 1 \\ 0 & 0 & 1 & 0 & 0 & 0 & 0 & 1 \\ 0 & 0 & 0 & 1 & 0 & 0 & 0 & 1 \\ 0 & 0 & 0 & 0 & 1 & 0 & 0 & 0 \\ 0 & 0 & 0 & 0 & 0 & 1 & 0 & 0 \\ 0 & 0 & 0 & 0 & 0 & 0 & 1 & 0 \end{pmatrix} \tag{4}$$

The matrices P and W obtained in accordance with the above expressions (2) and (3) for every eighteenth pixel (they may be regarded as codes corresponding to two pixels each consisting of eight bits, respectively) are added upon recording of the coded picture signal on a magnetic tape.

In practice, when the coded picture signal is recorded on the VTR, more than two error correction codes and/or error detection codes are combined for realizing the higher correction and detection capability. In this connection, description will be made by taking as an example a cyclic redundancy check code (hereinafter referred to as CRCC is to in abbreviation). In case CRCC be created for addition to a picture code consisting of eight bits upon recording thereof, the CRCC consisting of eight bits (or an integral multiple of eights bits) is preferred. The principle of creation or generation of the CRCC is known. Describing briefly on the assumption that the CRCC is created from the codes corresponding to eighteen pixels by way of example, 144 bits of W(1) to W(18) are arrayed and dealt with as a single code polynomial Y. Then, a remainder R resulting from division of the polynomial Y by a generating polynomial G represents the code polynomial of the CRCC.

FIGS. 1a and 1b of the accompanying drawings illustrates a code structure in which the aforementioned b-adjacent code and CRCC are arrayed two-dimensionally.

Picture codes are represented by W(1, 1), W(1, 2), W(1, 3) . . . , W(1, 18), W(2, 1), W(2, 2), . . . , W(2, 18), . . . , W(17, 1), W(17, 2), . . . , W(17, 18), W(18, 1), . . . , W(18, 18) in view of the sequence in which these picture codes are generated. From W(i, j) (where i=1, . . . 18), P(j) and Q(j) are created. From W(i, j) (where j=1, . . . , 18), R(i) (where i=1, . . . , 18) is created. From P(j) (where j=1, . . . , 18), R(19) is created. From Q(j) (where j=1, . . . , 18), R(20) is created. Usually, P(j), Q(j) and R(i) are created by utilizing all eight bits constituting each of W(i, j) (where i=1, . . . , 18 and j=1, . . . , 18). Subsequently, W(1, 1), W(1, 2), . . . , W(1, 18), R(1), W(2, 1), W(2, 2), . . . , W(2, 18), R(2), . . . , W(17, 1), W(17, 2), . . . , W(17, 18), R(17), W(18, 1), W(18, 2), . . . , W(18, 18), R(18), P(1), P(2), . . . , P(18), R(19), Q(1), Q(2), . . . , Q(18) and R(20) are recorded on magnetic tape in this order.

The data recorded on the tape is subjected to the code error correction and/or detection with the aid of the known b-adjacent codes and the CRCC. In the case of the numerical example mentioned above, when the presence or inclusion of error bits in the twenty pixels in total inclusive of P and Q is determined by other means, the error detection and correction can be performed if the number of the pixels suffering the bit error is not greater than two, while only the error detection is possible if the error pixels amount to more than three, inclusive. When the probability of pixel containing error is represented by p, the probability q of uncorrectability or incorrigibility is determined as follows:

$$q = \sum_{i=3}^{20} {}_{20}C_i p^i \cdot (1-p)^{20-i} \quad (5)$$

$$= \sum_{i=3}^{20} \left( \frac{(20)(19)\ldots(20-i+1)}{(i)!} \right) p^i \cdot (1-p)^{20-i} \quad (6)$$

$$= \frac{20 \cdot 19 \cdot 18}{3 \cdot 2 \cdot 1} p^3 (1-p)^{17} + \quad (7)$$

$$\frac{20 \cdot 19 \cdot 18 \cdot 17}{4 \cdot 3 \cdot 2 \cdot 1} p^4 (1-p)^{16} + \ldots \approx 1140 p^3$$

where $p \ll 1$.

This probability q of uncorrectability is too high to be satisfied by those observing the reproduced picture. Accordingly, there is a demand for improvement of the recording medium and the high error correcting capability.

SUMMARY OF THE INVENTION

An object of the present invention is to provide code error correcting method and apparatus in which the error correction and/or detection capability is enhanced by imparting a greater code error correcting capability to the high-order or more significant bits than the low-order or less significant bits by making use of a high chromographical autocorrelation of the video signal, while the code arrangement upon recording on a VRT is simplified as in the case of the hitherto known code structures, and which are suited for the processing for the code correction performed on a pixel basis.

Another object of the present invention is to provide a code error correcting method and apparatus in which the overall code arrangement can be made identical with the hitherto known code structure and can be realized by existing means by virtue of such a feature that the more significant bits of a given pixel are added with less significant bits of other pixel or the bits of a predetermined code to thereby create a new pixel.

According to the present invention, the error correction/detection capability for the more significant bits or high-order bits can be significantly enhanced by leaving the less significant bit error as it is, while performing the error correction processing for the more significant bits.

According to an aspect of the present invention, the more significant bits of plural pixels are simultaneously subjected to the error pixel correction/detection processing on a pixel basis. In that case, the less significant bits or the low-order bits are dealt with as a constant code. The format of the codes to be recorded on the VTR is the same as that of the hitherto known coding system. Further, the apparatus required for the correction/detection processing according to the present invention can be implemented by using the existing apparatus.

BRIEF DESCRIPTION OF THE DRAWINGS

FIGS. 1a and 1b are views showing, respectively, formats for data, and the error correction codes added thereto, to be recorded on a recording medium;

FIG. 2 is a view showing a circuit configuration for generating error correction codes (P, Q);

FIGS. 3a and 3b are views for illustrating timings at which correction codes (P, Q, R) are inserted in the data to be recorded;

FIG. 5 is a view for illustrating codes obtained with the circuits shown in FIG. 2;

FIG. 6 is a view showing a circuit configuration for realizing addition of a code R;

FIG. 7 is a view for illustrating the code R obtained at the output of the circuit shown in FIG. 6.

DESCRIPTION OF THE PREFERRED EMBODIMENTS

Figure 4A:
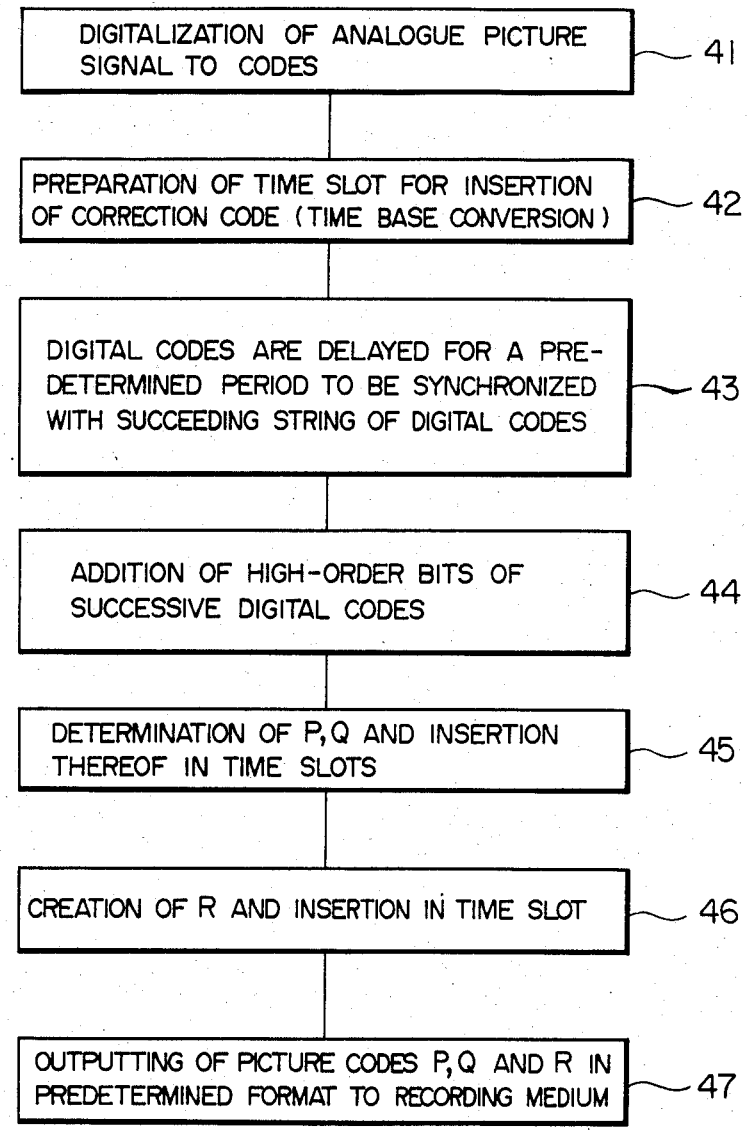
FIGS. 4a and 4b are flow charts for illustrating, respectively, processing steps of creating codes for correcting error involved in digital signal codes converted from an analogue picture signal and processing steps for error correction upon reproduction.

FIG. 2 shows a circuit for creating correction codes P and Q according to an exemplary embodiment of the invention. The processing for creating the correction codes P and Q is illustrated in a flow chart in FIG. 4a. Referring to FIG. 2 together with FIG. 4a, an analogue picture signal applied to an input terminal 1 is converted to a series of codes each consisting of eight bits through an A/D converter 2 (step 41). A series of the picture codes outputted from the A/D converter 2 is then supplied to a time base conversion circuit 3 where the picture code series or string is allocated with time slots or spaces for allowing the codes R, P and Q to be inserted therein (step 42). In case only the b-adjacent code is to be added to the data code series or string for effecting error correction or detection upon reproduction, it is sufficient to produce the slots for inserting only the codes P and Q in the code string. First of all, the error correction with the aid of a b-adjacent code will be described, by way of example.

Although the picture code represents inherently a continuous signal, it is required to provide time slots each corresponding to one pixel for adding the CRCC at very eighteenth pixel and time slots corresponding to 19×2 pixels for adding the codes P, Q and CRCC at every (19×18)-th pixel. To this end, a timing clock for controlling operation of the time base conversion circuit 3 may be so set that the output rate thereof is equal to the input rate multiplied by (19×20)/(18×18). Alternatively, the correction/detection codes may be inserted so as to fall within a period corresponding to the fly-back time. In that case, the input/output operations of the time base conversion circuit can be controlled by employing the same timing or clock signal.

A reference numeral 4 denotes a delay circuit having a delay time corresponding to 19 pixels. The outputs of the delay circuit 4 and the time base conversion circuit 3, i.e. W(1, 1) and W(2, 1) are simultaneously inputted to a switch circuit 5 at a given time point, being followed by a succeeding time point at which W(1, 2) and W(2, 2) are simultaneously inputted to the switch circuit 5. The switch circuit 5 is changed over at every nineteenth pixel. During a first period corresponding to 19 pixels, 18 codes which include an 8-bit code consisting of a sum of four more significant bits or high-order bits of pixel codes W(1, 1) and W(2, 1), an 8-bit code consisting of a sum of four high-order bits of W(1, 2) and W(2, 2), ..., and an 8-bit code consisting of a sum of four high-order bits of W(1, 18) and W(2, 18) are outputted from the switch circuit 5. During a succeeding period corresponding to 19 pixels, the switch circuit 5 is changed over to the position where output of 0 (zero) level is produced. During a third 19-pixel period, 18 eight-bit codes including an 8-bit code consisting of a sum of four high-order bits of pixel codes W(3, 1) and W(4, 1), an 8-bit code consisting of a sum of four high-order bits of W(3, 2) and W(4, 2), ..., and an 8-bit code consisting of a sum of four high-order bits of W(3, 18) nd W(4, 18) are outputted from the switch circuit 5. During the fourth 19-pixel period, the switch circuit 5 is changed over to the state in which the output is zero (step 43). In general, 18 virtual or pseudo pixels W(m, j) (where j=1, ..., 18) each consisting of eight bits including the four more significant bits (first to fourth bits) of W(2m−1, j) and W(2m, j) (where m=1, ... 9), respectively, are outputted from the switch circuit 5 during every other period (odd-numbered period) corresponding to 19 pixels (step 44), as is illustrated in FIG. 5. Accordingly, the following expression is valid.

$$W'(m, j) = \begin{pmatrix} a_{2m-1'1(j)} \\ a_{2m-1'2(j)} \\ a_{2m-1'3(j)} \\ a_{2m-1'4(j)} \\ a_{2m'1(j)} \\ a_{2m'2(j)} \\ a_{2m'3(j)} \\ a_{2m'4(j)} \end{pmatrix} \quad (8)$$

In FIG. 5, it is shown at the rightmost column that R(m) is outputted during the period corresponding to one pixel. However, since no picture code is present during this period due to operation of the time base conversion circuit 3, the outputted code is meaningless, as indicated by a symbol "?". Insertion of CRCC in this period or time slot will be described hereinafter by referring to FIG. 6.

Turning to FIG. 2, a read-only memory or ROM 6 stored therein the matrix data T given by the expression (4). A reference numeral 7 denotes a switch circuit serving to gate the output data of the ROM 6 to a delay circuit 8a during the odd-numbered 19-pixel period during which the switch circuit 5 produces the picture codes, while during the even-numbered 19-pixel period in which the output of the switch circuit 5 is zero, the output of the switch circuit 7 is coupled to the input of the matrix ROM 6. The delay circuit 8a has a delay time corresponding to 19 pixels. A reference numeral 9 denotes an adder composed of an Exclusive-OR element.

With the circuit arrangement mentioned above, the b-adjacent correction codes are creted in accordance with $$P'(j) = \sum_{m=1}^{s} W'(m,j) \quad (9)$$

$$Q'(j) = \sum_{m=1}^{s} T^{9-m} W'(m,j). \quad (10)$$

Thus, when the output of the switch circuit 5 is W'(9, j) of eight bits including the four high-order bits of W(17, j) and W(18, j), respectively, the output of the switch circuit 7 is Q(j).

A reference symbol 8b denotes a delay circuit involving a delay corresponding to 19 pixels, and 10 denotes an adder circuit based on the Exclusive-OR function. With this circuit arrangement, the output of the adder circuit 10 is P(j) when the output of the switch circuit 5 is W'(9, j). In this manner, when nine codes W'(m, j) are inputted to the encoder of the hitherto known structure in place of eighteen codes W(i, j), there can be created new correction codes P'(j) and Q'(j) (step 45).

When the number of the pixels suffering a bit error is not greater than two among the eleven pixels composed of the codes P', Q' and W'(m, j), error detection and correction can be performed. When the number of pixels suffering the bit error is not smaller than three, error detection is enabled. Accordingly, the probability (q') of uncorrectability is given by $$q' = \sum_{m=3}^{11} {}_{11}C_m p^m (1-p)^{11-m} \quad (11)$$

$$= {}_{11}C_3 p^3 (1-p)^8 + {}_{11}C_4 p^4 (1-p)^7 + \ldots + \quad (12)$$

$$\approx {}_{11}C_3 p^3 (1-p)^8 \quad {}_{11}C_{11} p^{11}(1-p)^0 \quad (13)$$

$$\approx 165 p^3 \quad (14)$$

$$p \leq 1$$

The ratio of the probability of uncorrectability (q') to the probability (q) which can be realized according to the prior art and given by the expression (7) is $$q'/q = 165/1140 \quad (15)$$

$$= 0.14 \quad (16)$$

The expression (16) indicates that the probability of uncorrectability (or incorrigibility) can be reduced to 14% of the corresponding probability attained heretofore by employing W'(m, j) in place of W(i, j).

Turning back to FIG. 2, a numeral 11 denotes a switch circuit which functions to select the output of the time base conversion circuit 3 during the first period corresponding to 342 (=19×18) pixels, while selecting the output of the delay circuit 8b during the succeeding period corresponding to 19 pixels and then the output of the delay circuit 8a during the next succeeding period corresponding to 19 pixels.

By repeating the operation described above periodically at a time interval corresponding to $19 \times 20$ pixels, the code string composed of a picture data code juxtaposed with the error correction codes P and Q is produced at the output of the switch circuit 11. It should be mentioned that the contents of the delay circuits 8a and 9a are cleared to zero immediately after appearance of the output of the switch circuit 11, although it is not illustrated in FIG. 2. It should further be pointed out that the encoder as well as the decoder required for error correction and/or detection processing may be constituted by the hitherto known devices. It is only necessary to insert a circuit for converting $W(i, j)$ to $W'(m, j)$ upstream of the encoder while providing a circuit for converting $W'(m, j)$ to $W(i, j)$ downstream of the decoder. In other words, the probability of error correctability can be increased by modifying the hitherto known apparatus only a little. Obviously, the correction and/or detection of the error which the bits $a_{i,5}$ to $a_{i,8}$ contained in the code $W(i, j)$ may suffer can not be effected. However, degradation in the image quality due to such bit error can remain within a permissible range, as described in the literature cited hereinbefore.

The foregoing description has been made in conjunction with the b-adjacent code for correcting the pixel data possibly containing an error on a pixel basis. Next, a second embodiment of the invention adapted for addition of CRCC for correcting the bit error on a bit basis will be described. The series of bits $a_{i,1}, a_{i,2}, \ldots, a_{i,7}$ and $a_{i,8}$ of each of the pixels $W(i, j)$ (where $i = 1, \ldots, 18$) added with "0s" in number of $(20-1) \times 8$ is regarded as a code polynomial. The remainder resulting from the division of this code polynomial by the generating polynomial mentioned hereinbefore is represented by Ri. Then, by taking into account the known relation given by $$R = \sum_{i=1}^{18} Ri \quad (17)$$

the correction code CRCC can be obtained by resorting to the aforementioned processing performed on a pixel basis. More specifically, in place of deriving $Ri(j)$ from $W(i, j)$ as in the case of the hitherto known process, a remainder $R'm(j)$ is derived from $W'(m, j)$ produced in carrying out the first embodiment in accordance with $$R'(j) = \sum_{m=1}^{9} R'm(j) \quad (18)$$

and the remainder $R'm(j)$ is employed as the CRCC (step 46). In this connection, it should be noted that the circuit for deriving $R'm(j)$ from $W'(m, j)$ is the same as the prior art circuit for deriving $Ri(j)$ from $W(i, j)$, while the circuit for deriving $R'(j)$ from $R'm(j)$ is same as the circuit for deriving R from $Ri(j)$. It is only required to add a circuit for conversion between $W(i, j)$ and $W'(m)$. Since the principle of detecting the code error by using the CRCC is known in the art, description thereof will be unnecessary. Let's consider again the example described hereinbefore. When the code R corresponding to one pixel is added to the data code $W(i, j)$ corresponding to 18 pixels, any code error up to eight-bit-burst length possibly present in 19 pixels (152 bits) in total can be detected without fail, while the code error exceeding an eight-bit-burst length will be ignored with a probability of $\frac{1}{2}^8$. In contrast, when R' corresponding to one pixel is added to $W'(m)$ corresponding to 9 pixels according to the teaching of the invention, any code error of magnitude up to eight bits in 10 pixels (80 bits) in total can be detected without fail.

When the bit error rate is represented by g, the probability h at which the burst errors over eight bits among 152 bits may occur is given by $$h = \sum_{i=1}^{144} ig^2(1-g)^{i-1} \quad (19)$$

$$\simeq 10440 \, g^2 \quad (20)$$

On the other hand, the probability h' at which error of more than eight bits among 80 bits occurs is given by $$h' = \sum_{i=i}^{72} ig^2(1-g)^{i-1} \quad (21)$$

$$\simeq 2628 \, g^2 \quad (22)$$

Accordingly, $$h'/h \simeq \tfrac{1}{4} \quad (23)$$

It is thus apparent that the probability at which the error can not be detected with high reliability by using the CRCC can be reduced to $\tfrac{1}{4}$ of the corresponding probability attainable by the prior art method.

It should however be pointed out that the code CRCC is inherently a code to be processed on a bit basis. In other words, although creation of the code CRCC can be realized on a pixel basis, the detection capability is determined in dependence on the number of bits constituting the code CRCC. Accordingly, a code $W^*(i, j)$ corresponding to the digital picture code $W(i, j)$ in which four less significant bits $a_{i,5}, \ldots, a_{i,8}$ are regarded as constants $a_{0,5}, \ldots, a_{0,8}$, respectively, may be used according to a third embodiment of the invention. The code $W^*(i, j)$ is given by $$W^*(i,j) = \begin{pmatrix} a_{i,1} \\ a_{i,2} \\ a_{i,3} \\ a_{i,4} \\ a_{o,5} \\ a_{o,6} \\ a_{o,7} \\ a_{o,8} \end{pmatrix} \quad (24)$$

where $a_{0,5}, \ldots, a_{0,8}$ represent constants having no relation to the inherent code bits $a_{i,5}, \ldots, a_{i,8}$. With the term "constant", it is intended to mean that the bits $a_{0,5}, \ldots, a_{0,8}$ are the same either upon creation of the code CRCC or at the time of error detection by using the CRCC. In a simplified example, $$a_{0,5} = a_{0,6} = a_{0,7} = a_{0,8} = 0 \quad (25)$$

FIG. 6 shows, by way of example, a circuit configuration for creating the remainder polynomial R which serves as the CRCC. Referring to FIG. 6, an input terminal 13 is connected to the output terminal 12 of the circuit arrangement shown in FIG. 2. The four less significant bits of each of the picture data codes as inputted is converted to a string of "0s" by means of a switch circuit 14. On the basis of the new code W*(i, j) consisting of the output from the switch 14 and the four more significant bits of the aforenoted picture data code as well as a signal j indicating which row the code W*(i, j) should belong to, the remainder R*(j) is created in the ROM 15. A reference numeral 16 denotes a delay circuit corresponding to one pixel, and 17 denotes an adder circuit, both cooperating to perform the arithmetic operation defined by $$R'' = \sum_{j=1}^{18} R^*(j)$$

More specifically, in response to a code W(i, 18) applied to the input terminal 13, the adder 17 produces R(i) as the output thereof (step 46). A numeral 18 denotes a switch for changing over W(i, j) and R(i) to each other and producing the codes of the i-th row (FIG. 1) at the output terminal 19.

When a code W(i, j) is of 18 pixels, then the code W*(i, j) is also of 18 pixels. The remainder R* derived from W*(i) of 18 pixels differs from both of the remainders R and R' mentioned hereinbefore. However, since the bits $a_{0,5}, \ldots, a_{0,8}$ are constant independent of code error possibly produced in the course of recording and/or reproduction, the remainder R* can exhibit the same detection capability as that of the remainder R'.

The code string produced at the output terminal 19 includes the data codes (i, j) illustrated in FIG. 1, the b-adjacent codes P(j) and Q(j) illustrated in FIG. 5 and the CRCC code R(i) illustrated in FIG. 7. The output code string is of the same structure as the hitherto known code string when viewed as a whole. These codes are converted to signals suited for magnetic recording and recorded on the VTR in order of W(1, 1), ..., W(1, 18), R(1), W(2, 1), ..., W(2, 18), R(2), W(17, 1), ..., W(17, 18), R(17), W(18, 1), ..., W(18, 18), R(18), P(1), ..., P(18), R(19), Q(1), ..., Q(18) and finally R(20) (step 47).

The signals reproduced from the VTR are restored to the original signals through a conversion process reverse to that effected upon recording.

Figure 4B:
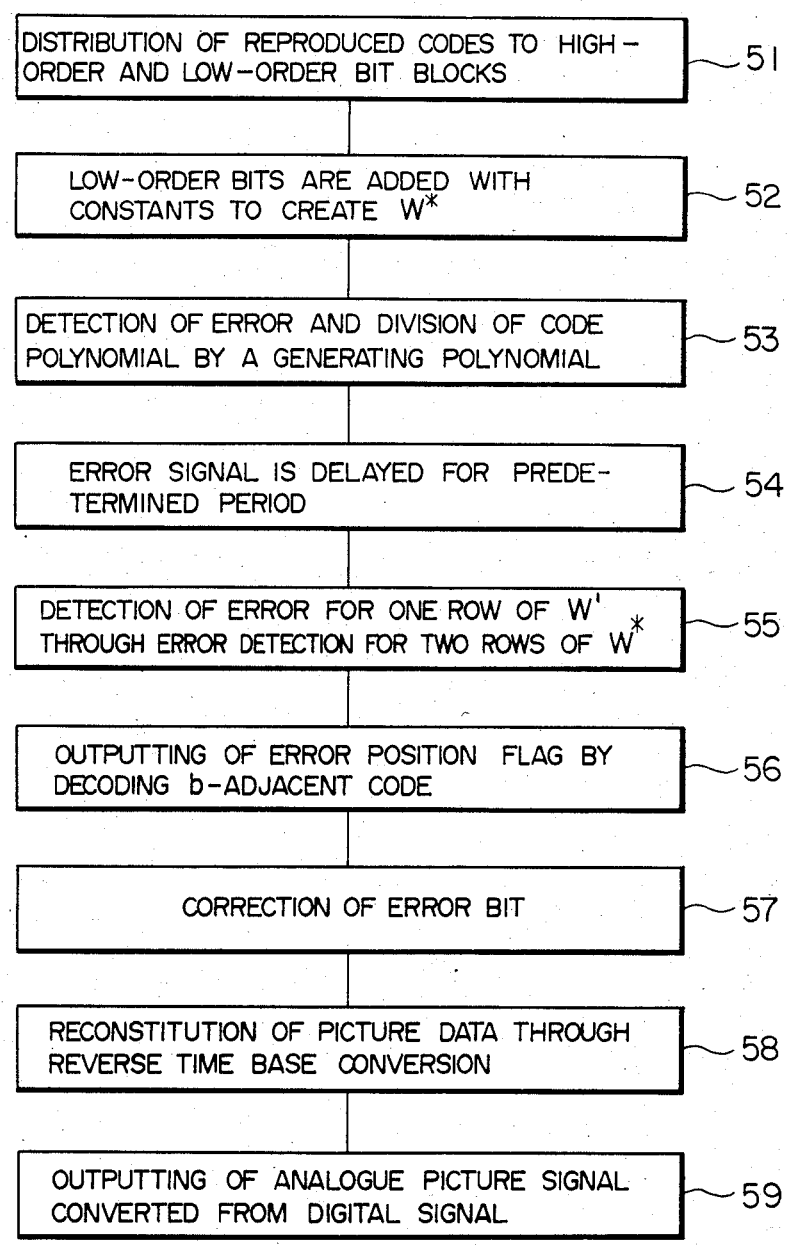
Figure 8:
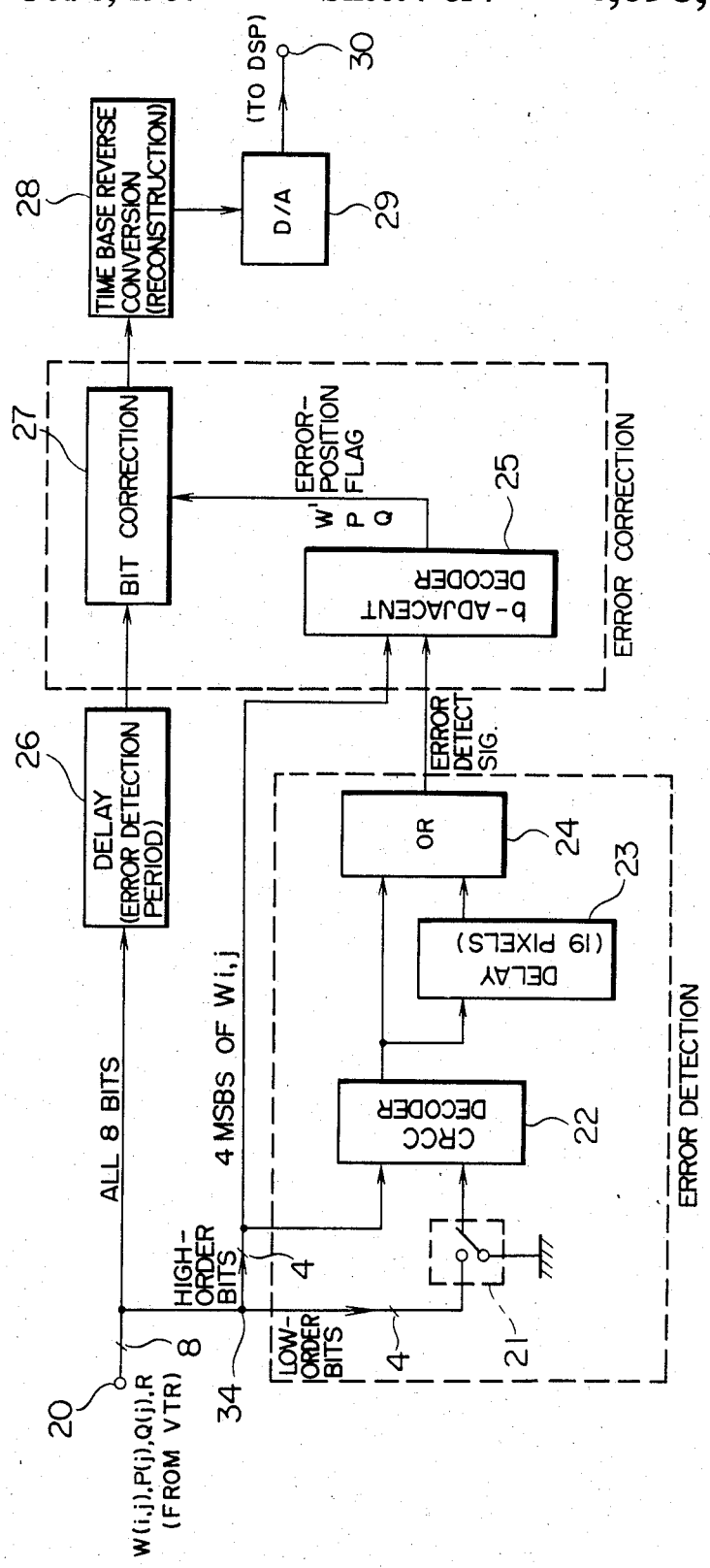
FIG. 8 shows in a block diagram a circuit for supplying to a display unit data of high quality including data reproduced from a recording medium which has undergone error correction.

FIG. 8 shows an error correction circuit according to an embodiment of the invention. Reverse conversion process or reproducing process is illustrated in FIG. 4b. Referring to both figures, each of the reproduced codes appearing at a terminal 20 is divided into or distributed as four more significant bits (high-order bits) and four less significant bits (low-order bits) (at step 51), wherein the four LSBs are set to "0s" through a switch circuit 21 only during the corresponding bit period. Thus, the reproduced pixel code W(i, j) can be regarded as the code W*(i, j) mentioned hereinbefore in conjunction with the third embodiment of the invention. The CRCC decoding circuit 22 serves to divide the code polynomial consisting of W*(i, j) (where j=1, ..., 18) and R(i) by the same generating polynomial as that used in the encoder 15 shown in FIG. 6. When the remainder is zero, it is decided that no error is involved. Otherwise, it is decided that error exists (step 53). Since the four LSBs of the code W*(i, j) are constantly zero, error, if found, may be regarded to exist in the four high-order bits of the code W*(i, j), i.e. it is considered that the error is present in the four high-order bits of W(i, j) illustrated in FIG. 1a or b. On the other hand, corresponding to the encoding in the first or second embodiments, the circuit 22 may include a circuit for reconstructing eight-bit pixels W'(m, j) from the high-order four bit data inputted from the terminal 20.

A reference numeral 23 denotes a delay circuit corresponding to 19 pixels which delays the signal outputted from the CRCC decoding circuit 22 and indicating the presence or absence of error (step 54). An OR circuit 24 determines a logical sum of two rows, resulting in detection of error in the code W'(i, j) (where j=1, ..., 18) shown in FIG. 5 (step 55). A reference numeral 25 denotes a b-adjacent code decoder circuit which serves to synthesize the four high-order bits of the reproduced codes W(i, j) to create W'(i, j) for thereby detecting the erroneous bit from the signal indicative of presence or absence of error in the code which consists of P(j), Q(j) and W'(i, j) outputted from the OR circuit 24. More specifically, when two or less pixels suffering error are present in eleven pixel codes composed on W'(i, j) (where i=1, ..., 9), P(j) and Q(j), the position of the erroneous bit or bits is detected. When more than three pixels, inclusive, are present, the bit positions at which error is likely to be present are detected (step 56).

The regenerated code is delayed by a delay circuit 26 for a time required for detecting the position of a bit suffering error in the circuits 21 to 25, nd the erroneous bit as detected is corrected by a bit correcting circuit 27 (i.e. inversion of the binary bit) (step 57). More specifically, if the erroneous bit position is identified, the polarity of the bit of the associated pixel code W(i, j) at the position is inverted by the circuit 27 and the associated pixel code W(i, j) is replaced by a pixel code which exhibits high correlation with the error-suffering code W(i, j) and which may be, for example, an adjacent pixel code belonging to an immediately preceding scan. From the description made so far, it will be understood that error possibly present in the four high-order bits of a reproduced code is corrected, and if correction is impossible, the code suffering from the bit error is replaced by a code exhibiting high correlation to correctively modify or conceal the erroneous code, while error present only in the four LSBs is left as it is.

A reference numeral 28 denotes a time base conversion circuit which operates in a manner reverse to the operation of the time base conversion circuit 3 shown in FIG. 2 (step 58). More specifically, the codes P, Q and R are deleted from the corrected code string to thereby reproduce the code string which consists only of the picture codes W(i, j), which is then converted to an analogue picture signal through a digital-to-analogue converter 29 to be outputted from a terminal 30.

In the foregoing description of the exemplary embodiments of the invention, it has been assumed that the b-adjacent code and the CRCC code are made use of. However, it should be appreciated that the teaching of the invention can be applied to error correction and/or detection in a more general sense. More specifically, so far as such corresponding/detection code is concerned whose correction/detection capability is determined by the number of the pixels suffering error independent of the number of the error bits contained in the erroneous pixel code (e.g. as in the case of b-adjacent), a new pixel is prepared by correcting the more significant bits of the codes constituting the pixels, respectively, wherein the new pixel is used for creating and decoding the code for error correction and/or detection. On the other hand, for the correction/detection code whose correction/detection capability is determined in dependence on whether the number of error bits contained in a given pixel exceeds a predetermined number (e.g. as in the case of CRCC etc.), a new pixel is created by regarding the less significant bits of the code constituting the pixel as a constant code and used for creating and decoding a code for correction and/or detection.

In this connection, it should be noted that for the second mentioned code in which the number of error bits is of significance, the first mentioned method of constituting the new pixel by correcting the high-order bits can be applied to the same effect. However, the second mentioned method of preparing the new pixel by regarding the low-order bits as the constant code can not be successfully applied to the first mentioned code creating method in which the number of the erroneous pixels is of significance for the reason mentioned below. In case the low-order bits are regarded as the constant or invariable code, the correcting and/or detecting operation can be carried out for the high-order bits. However, this means that the correction and/or detection is effected only for the four bits among the eight bits constituting a single pixel, while the correction and/or detection capability for the four remaining bits are neglected.

In the foregoing description, it has also been assumed that one new pixel is constituted by four high-order bits of two pixels. It should however be noted that the number of bits as well as the number of pixels may assume other values. For example, a new pixel may be virtually prepared by two high-order bits extracted from each of four pixels. Further, three new pixels may be prepared by using six high-order bits extracted from each of four pixels. Moreover, a new pixel of six bits constituted by three high-order bits of two pixles, respectively, may be used. In brief, a variety of numerical combinations may be conceived in dependence on the number of high-order bits which arre to undergo correction and/or detection processing.

The invention has been described in conjunction with the exemplary embodiments which are adapted for performing correction and/or detection of error possibly produced in the course of recording and reproducing data. It should howeverbe understood that the teaching of the invention can be equally applied to a transmitter/receiver system by installing the apparatus according to the invention in a channel for transmitting a digital image signal, wherein error correction is performed on the side of the receiver.

We claim:

1. A digitallized picture signal recording apparatus, comprising:
    (a) input means for supplying a digital signal including pixel codes each composed on plural bits in a time-sequential manner;
    (b) means connected to said input means for delaying said digital signal for every predetermined number of said pixel codes;
    (c) means connected to said input means and said delay means for producing pseudo pixel codes by adding more significant bits of those ones of said delayed pixel codes to more significant ones of said plural bits of said pixel codes received from said input means;
    (d) means connected to receive said pseudo pixel codes for generating error correcting codes based on said pesudo pixel codes;
    (e) means for adding said error correcting code to said digital signal to produce a recording data signal; and
    (f) recording means for recording said recording data signal on a recording medium.

2. A digitallized picture signal recording apparatus according to claim 1, wherein said means for producing said pseudo pixel codes includes means for producing a predetermined constant for a period corresponding to a predetermined number of said pixel codes in succession to the outputting of a pseudo pixel code.

3. A digitallized picture signal recording apparatus according to claim 2, wherein said predetermined constant is "0" (zero).

4. A digitallized picture signal recording apparatus according to claim 1, further comprising:
    receiving means connected to receive as an input thereto said digital signal reproduced from said recording medium to distribute the more significant bits and the less significant bits in the same bit structures as said more significant bits and said less significant bits;
    error indication producing means responsive to the output of said receiving means for producing a signal indicative of the presence or absence of error on the basis of said distribution more significant bits and a predetermined constant value added thereto;
    decoder means connected to said receiving means and said error indication producing means for receiving as inputs thereto the output of said error signal producing means and said more significant bits to produce a flag designating a bit position of said digital signal where error is present; and
    means responsive to the output of said decoder means and connected to receive said digital signal for correcting the error bit appearing at a time point when said flag is received.

5. A digitalized picture signal recording apparatus, comprising:
    (a) input means for supplying sequentially a digital signal, including plural pixel codes each composed of plural bits;
    (b) means connected to said input means for creating an error correcting code by replacing less significant bits of said pixel codes of said digital signal by predetermined constants;
    (c) means for changing over said error correcting codes and said pixel codes so that they are accommodated in a predetermined format; and
    (d) means connected to said changing means for recording said error correcting codes and said digital codes.

6. A digitalized picture signal recording apparatus, comprising:
    (a) input means for supplying a digital signal including pixel codes each composed of plural bits in a time-sequential manner;
    (b) means connected to said input means for delaying said digital signal for every predetermined number of said pixel codes;
    (c) means connected to said input means and said delay means for producing pseudo pixel codes by adding more significant bits of those ones of said delayed pixel codes to more significant bits of said plural bits of the pixel codes received from said input means;

(d) means connected to receive said pseudo pixel codes for generating a first error correcting code therefrom;

(e) means connected to receive as an input thereto said digital signal for replacing the less significant bits of said pixel codes thereof by predetermined constants to thereby create a second error correcting code; and (f) means for changing over said first and second error correcting codes and said pixel codes of said digital signal so that they are accommodated in a predetermined format; and (g) means connected to said changing over means for recording said error correcting codes and said digital signal.

7. A digitalized picture signal recording apparatus according to claim 6, further comprising:

receiving means connected to receive as an input thereto said digital signal reproduced from said recording medium to distribute the more significant bits and the less significant bits in the same bit structures as said more significant bits and said less significant bits;

error indication producing means responsive to the output of said receiving means for producing a signal indicative of the presence or absence of error on the basis of said distributed more significant bits and a predetermined constant value added thereto;

decoder means connected to said receiving means and said error indication producing means for receiving as inputs thereto the output of said error signal producing means and said more significant bits to produce a flag designating a bit position of said digital signal where error is present; and means responsive to the output of said decoder means and connected to receive said digital signal for correcting the error bit appearing at a time point when said flag is received.

8. A digitalized picture signal recording apparatus according to claim 6, wherein said first error correcting code is a b-adjacent code and said second error correcting code is a cyclic redundancy check code.

9. A method of recording a digitalized picture signal, comprising steps of:

(a) converting an analogue picture signal to a digital signal to obtain a series of pixel codes which are sequential in time;

(b) delaying said series of pixel codes for a time corresponding to a predetermined number of pixels;

(c) preparing pseudo pixels codes which are sequential in time from the more significant bits of predetermined successive pixel codes of said digital signal and the more significant bits of predetermined delayed pixel codes; p1 (d) preparing error correcting codes on the basis of said pseudo pixel codes;

(e) adding said error correcting codes to said series of pixel codes of said digital signal to produce a recording signal; and (f) recording said recording signal on a record medium.

10. A method of recording a digitalized picture signal according to claim 9, wherein said error correcting code is a b-adjacent code, and said recording medium is a video tape.

* * * * *